United States Patent [19]
Atterbury et al.

[11] 4,378,322
[45] Mar. 29, 1983

[54] ELECTROMAGNETIC RADIATION SHIELDING COMPOSITES AND METHOD OF PRODUCTION THEREOF

[75] Inventors: Thomas J. Atterbury; David E. Stutz, both of Columbus, Ohio

[73] Assignee: Transmet Corporation, Columbus, Ohio

[21] Appl. No.: 156,812

[22] Filed: Jun. 5, 1980

[51] Int. Cl.³ .................... H05B 6/60; H02M 3/04
[52] U.S. Cl. .................................. 264/24; 264/26; 264/104; 264/105; 428/402
[58] Field of Search .............. 264/24, 22, 25–26, 264/27; 156/380; 428/402

[56] References Cited
U.S. PATENT DOCUMENTS

| 4,011,360 | 3/1977 | Walsh | 428/402 |
| 4,137,361 | 1/1979 | Deffeyes et al. | 428/328 |
| 4,216,423 | 8/1980 | Davenport | 320/1 |
| 4,218,507 | 8/1980 | Deffeyes et al. | 428/328 |
| 4,243,460 | 1/1981 | Nagler | 156/380 |
| 4,258,101 | 3/1981 | Hornbeck | 428/402 |

Primary Examiner—Jeffery R. Thurlow
Attorney, Agent, or Firm—Burns, Doane, Swecker & Mathis

[57] ABSTRACT

Preparation of electromagnetic radiation shielding composite exhibiting high conductivity and low resistance is shown by applying an electrical potential difference across a composite comprising an electrically conductive material dispersed within a foamed matrix material and applying at least one additional electrical potential difference being greater than the potential difference which precedes it.

17 Claims, 1 Drawing Figure

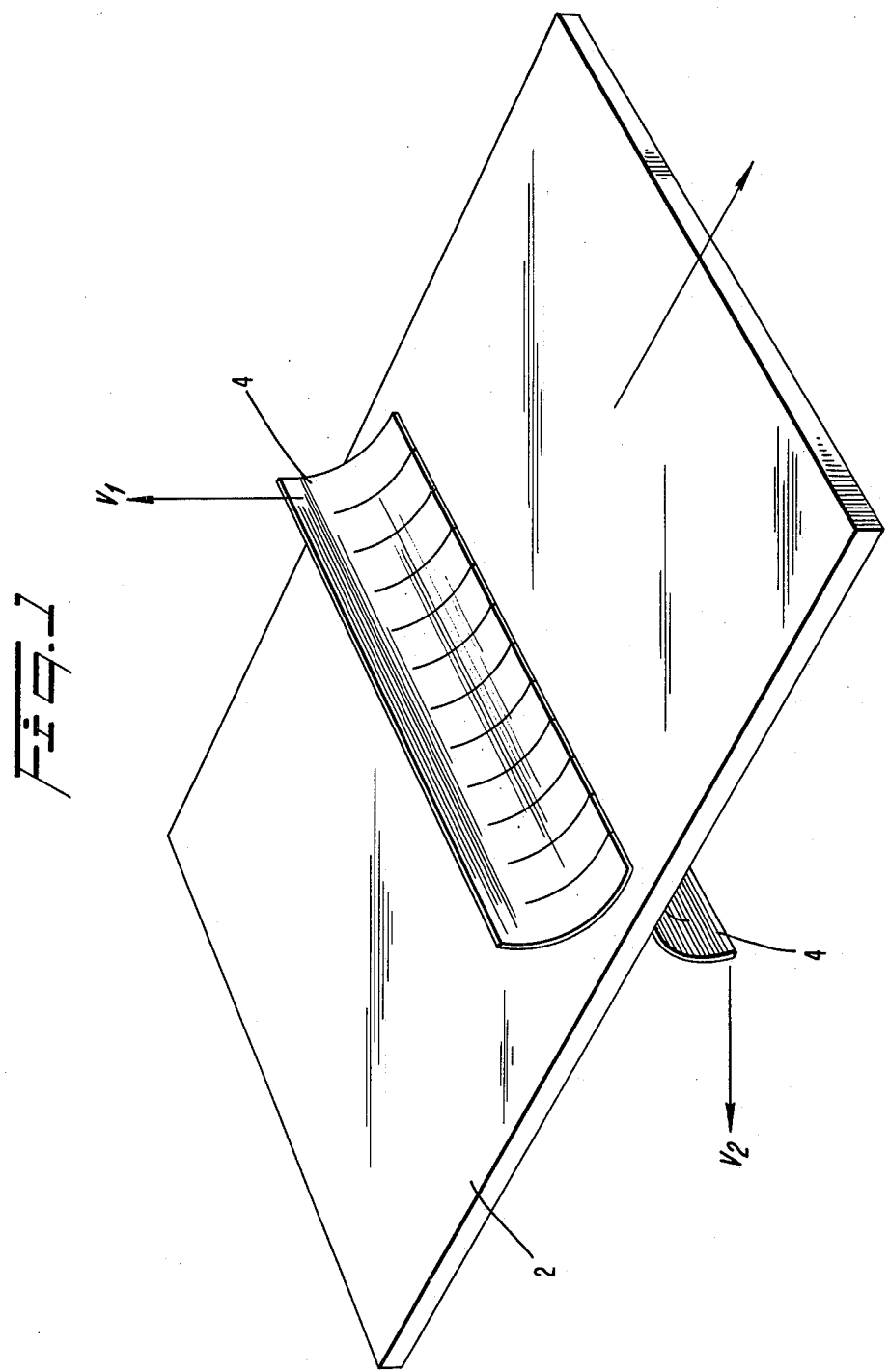

4,378,322

ELECTROMAGNETIC RADIATION SHIELDING COMPOSITES AND METHOD OF PRODUCTION THEREOF

BACKGROUND OF THE INVENTION

The present invention relates to electromagnetic radiation shielding composites which exhibit high conductivity.

As technology progresses and produces more sophisticated electronic equipment, the environment becomes more polluted with electromagnetic (EM) radiation. This radiation has recently become recognized as a significant hazard to the health of individuals as well as to the operation of electronic equipment, and in particular to digital equipment that is generally more easily adversely affected by spurious radiation. There is therefore a need to control such random and undirected radiated electromagnetic energy and also shield the environment (including both biological life and equipment) from its effects.

The shielding of both emitted radiation and incoming radiation has traditionally been done by metallic enclosures. Metal serves as a shield as a result of its high conductivity since the penetration of EM radiation is dependent upon the conductivity exhibited by the shield. In fact, continuous metal enclosures having a thickness in the range of 1/32 inch to 1/10 inch serve as effective shields for EM radiation over the radio-frequency band from the kilohertz to gigahertz range. The most common metallic enclosures are comprised of steel, aluminum and copper. However, such metallic shielding enclosures are unfortunately both heavy and costly.

As an alternative, equipment has been enclosed in plastic structures consisting of polymeric moulding compounds which include conductive materials such as metallic fibers, carbon fibers, etc. Composites have also been modified to produce higher conductivity by the use of surface treatments such as conductive paints, spray plating, flame spraying, or vacuum metallizing. However, these techniques often either prove to be too costly or do not sufficiently increase the conductivity of the structure to provide the desired amount of shielding.

Due to the flexibility of design provided by utilizing molded plastic parts as shielding composites, it is desirable to provide adequate electromagnetic shielding by incorporating metallic or other conductive materials (e.g., in flake or fiber form) into the polymeric matrix to eliminate the use of secondary coating operations. A further advantage of integrally incorporated particles is that control of the passage of electromagnetic waves is achieved by absorption as well as by reflection because of the bulk conductivity created.

However, there is presently a need for an efficient and economical means of providing shielding which exhibits minimal resistance and high conductivity. Due to the fact that only limited amounts of conductive materials can be incorporated into such shielding composites without imparing the ability of the matrix material from which the composite is made to be molded, it is desired to provide a method to increase the conductivity of the composite without also having to also unnecessarily increase the amount of conductive material employed.

In addition, the use of shielding composites comprised of structural foams is advantageous in certain instances where a lower weight composite is required. The maximum amount of conductive material which the foamed composite can contain may be less than the maximum amount which an unfoamed composite can contain since less effective volume may be available within which to disperse the material.

Therefore, it is desirable to provide a method by which the conductivity of such shielding composites can be increased over and above that exhibited by the composite subsequent to incorporation of the conductive material.

OBJECTS AND SUMMARY OF THE INVENTION

It is therefore an object of the present invention to provide an efficient method of providing a shielding composite possessing a high conductivity.

It is also an object of the present invention to provide an efficient method of providing a shielding composite which exhibits low resistance.

It is also an object of the present invention to provide a method of increasing the conductivity of a foamed shielding composite.

It is also an object of the present invention to obviate the problems of the prior art as discussed above.

In one aspect of the present invention there is provided a method of preparing an electromagnetic shielding composite which exhibits high conductivity and low resistance comprising:

providing a composite comprising an electrically conductive material dispersed within a matrix material; and applying an electrical potential difference across said composite of sufficient magnitude to increase the conductivity of the composite to the extent required to enable the composite to serve as an effective shield for electromagnetic radiation.

In another aspect of the present invention there is provide a method of preparing an electromagnetic radiation shielding composite which exhibits high conductivity and low resistance comprising:

providing a composite comprising an electrically conductive material dispersed within a matrix material; and applying an electrical potential difference across said composite such that a first and at least one additional electrical potential difference are applied across said composite, each said electrical potential difference being greater than the electrical potential difference which precedes it and each said additional electrical potential difference which is applied being of such a value so as to increase the conductivity of said composite in comparison to that which said composite exhibited prior to applying said additional electrical potential difference, said additional electrical potential difference being applied and the value thereof being increased until the conductivity of the composite is increased to the extent required to enable the composite to serve as an effective shield for electromagnetic radiation.

BRIEF DESCRIPTION OF THE DRAWING

FIG. 1 illustrates a means by which an electrical potential difference may be provided across a shielding composite in accordance with the method of the present invention.

DETAILED DESCRIPTION OF THE INVENTION

The electromagnetic radiation shielding composite of the present invention may take many forms. The composite is generally employed as a shield for electromagnetic radiation in the form of a three-dimensional composite which is shaped to provide the proper shielding effect. That is, the composite may consist of a sheet-like portion which may be used in conjunction with other sheet-like portions to form a multi-sided structure. Such a structure can be used to enclose equipment which is sensitive to the effects of electromagnetic radiation. Alternatively, the composite may take the form of a structure which is molded in a specific shape (e.g., a hemisphere) or a shape which conforms to the configuration of the equipment to be shielded.

The composite comprises a matrix of non-conductive material within which is dispersed an electrically conductive material. The matrix material serves as a binder or matrix for the electrically conductive material and provides structural integrity for the shielding composite. The matrix material preferably comprises a thermosetting or thermoplastic resinous material within which the conductive material can be dispersed. Suitable materials include but are not limited to addition polymers of aliphatic monoolefins, ethylenically unsaturated carboxylic acids and the esters thereof, conjugated dienes and ethylenically unsaturated nitriles, amines, ethers and ketones. Such materials also include polyamides, polyesters, polycarbonates, polyurethane and phenolic resins. Thermoplastic materials such as polyethylene and polycarbonate are most preferred. Various types of ceramic materials may also be used as the matrix material. One skilled in the art can readily determine which materials are suitable for use as a matrix material as such materials are conventional and well known in the art.

The method of the present invention finds particular applicability to shielding composites comprising a foamed matrix material within which is dispersed the electrically conductive material. Such a foamed matrix must be sufficiently dense to provide the desired structural integrity for the composite. Generally, the density of the foamed matrix will be between about 70 to 100 percent of the density exhibited by the unfoamed matrix material. The methods of manufacture of such a structural foams is known and includes the entrainment of air and the use of blowing agents to provide the foamed structure. Suitable structural foams which are commercially available include a polycarbonate structural foam denoted as General Electric FL 900 MOBAY FS600.

Several types of electrically conductive filler materials may be used. For example, the conductive filler material may consist of carbon fibers or finely divided metallic solids comprised of copper, zinc, aluminum, silver, iron, nickel, gold, tungsten, niobium, carbon steel and stainless steel as well as alloys or physical admixtures thereof. Aluminum is the preferred metal for use in the present invention. This listing of suitable conductive materials is not all-inclusive and other conventional types of electrically conductive materials may be used in the present invention.

The conductive material may also consist of non-conductive solids such as resinous or glass particles which have been coated with a conductive material (e.g., by conventional metallizing techniques) to render the solids conductive. Such non-conductive solids are preferably metallized such that the added metal forms a continuous layer on the surface of the non-conductive solid.

The conductive material may be in any suitable form or shape such as flakes, fibers, spherical or non-spherical particles or powders. The conductive material may be of any suitable size but should be of such a size that sufficient quantity of the solids may be dispersed within the matrix material to permit the desired conductivity to be achieved.

Exemplary sizes for metallic flakes may range from about 1 mil in thickness to about 50 by 40 mils in dimension. Exemplary fibers can range up to about 250 mils in length or greater and have a diameter of about 3 mils or greater. Preferably the length of such fibers is about 125 mils.

The quantity of conductive material which is dispersed within the matrix material will generally range from 5 percent by weight to about 60 percent by weight based on the weight of the composite. Amounts greater than that can be used advantageously. However, difficulty may then arise when attempting to admix the conductive material with the matrix material if the amounts of the conductive material which are used are too great. Preferably, the conductive material will be employed in an amount ranging from about 5 to 40 percent by weight to achieve adequate workability of the admixture as well as sufficient shielding effectiveness. A most preferred range is about 15 to 25 percent by weight. Generally, however, it has been found that a higher loading volume percent of the electrically conductive material will enable higher conductivity to be achieved both before and after treatment of the composite by the method of the present invention.

The composite which contains the electrically conductive material dispersed throughout a matrix material will exhibit a conductivity value in excess of that which is normally exhibited by the composite in the absence of the electrically conductive material (and, conversely, a lower resistivity). However, in order to both increase the conductivity and lower the resistivity exhibited by the composite, it is advantageous to subject the composite to the method of the present invention.

Specifically, the method of the present invention involves providing an electrical potential difference across the shielding composite of sufficient magnitude to increase the conductivity of the composite to the extent required to enable the composite to serve as an effective shield for electromagnetic radiation. The conductivity of the composite can be increased by several magnitudes as a result of using the method of the invention. Both the dc resistivity and the RF transmission of the composite are similarly changed radically.

The value for the potential difference which is provided to obtain the desired increase in conductivity will vary depending upon the type of matrix material employed as well as the type and amount of electrically conductive material dispersed therein. However, it has been found that providing a potential difference of between about 500 to 15,000 volts will be sufficient to achieve the desired results.

Generally, the conductivity of a composite comprised of an unfoamed matrix will be increased sufficiently as a result of providing an electrical potential difference which is lower than that which may required to provide similar results in a composite comprised of the same foamed matrix material due to the greater inherent resistance of the foamed composite. For example, it is possible that the conductivity of a shielding composite comprised of an unfoamed matrix material may be sufficiently increased by providing an electrical potential difference of from about 500 to 1000 volts. A similar shielding composite comprised of a foamed matrix material may require an electrical potential of from 6000 to 12,000 volts to provide the desired increase in conductivity. However, it is not possible to generalize about the magnitude of the electrical potential difference which will be required since it is dependent upon the physical characteristics of the shielding composite.

It is possible, however, that the potential difference which is necessary to sufficiently increase the conductivity of the shielding composite may be of such a magnitude that it will physically degrade the composite upon application. For example, the resistance of the composite may be so high that the ability of the composite to act as a conductor is exceeded. In such a case, arcing may occur and the composite may become burned or charred.

Such a consequence may be avoided by modifying the method by which the electrical potential difference is provided. That is, an electrical potential difference may be provided across the composite such that a first and at least one additional electrical potential difference are sequentially provided across the composite. Each potential difference which is provided in sequence is greater than the potential difference which was previously provided across the composite. As each additional potential difference is provided the conductivity of the composite will increase subject to the limitations discussed below.

The electrical potential differences which are provided across the composite are increased in magnitude a sufficient number of times and to such a final value so that the desired increase of conductivity and reduction in resistivity in the composite are provided. The number of potential differences which are provided is not critical as long as the desired results are achieved. Accordingly, the number of potential differences provided may be as few as two or, in the alternative, be much greater than two, such as, for example, ten or more. Satisfactory results can generally be obtained by providing from three to six potential differences across the composite of differing but increasing magnitudes. As will be discussed hereafter, the number of potential differences of differing magnitude which are required to produce the desired results depends to a great extent upon the individual magnitude of the potential differences provided.

The increase in magnitude of the electrical potential difference across the composite may be conducted in either a substantially continuous manner or in a stepwise manner (i.e., the value is increased intermittently). However, electrical potential differences are advantageously provided which are increased over a sufficiently large range of values.

The initial potential difference which is provided preferably is about 500 to 1000 volts. Advantageously, the value of each additional potential difference may be from 25 to 300 percent greater than the value of the potential difference which preceded it. An exemplary and non-limiting progression of values for the potential differences which may be provided may be 1000, 3000, 6000, 9000, 12,000 and 15,000 volts.

It will be observed that increasing the potential difference across the composite will increase the conductivity thereof up to a certain point. That is, no further improvement will generally be observed for the conductivity after a certain threshold value for the potential difference is exceeded. However, the threshold value generally varies with each matrix material and the amount and type of conductive material dispersed therein, so it is not possible to quantify such a value without some experimentation. However, the threshold value will generally be significantly less for a composite comprised of a matrix material which is not foamed as opposed to a matrix material which is foamed.

The electrical potential difference may be provided by many suitable methods, and is preferably provided in a direction which is perpendicular to the plane of the shield.

For example, one method of applying the electric field to the composite 2 involves the use of electrodes 4 which are applied to the surface of the composite in the form of phosphor-bronze finger stock such as are used for making contacts around the periphery of shielded room doors. These electrodes can be applied to both sides of a flat sheet-like composite and high-voltage applied to them. The composite is then passed between the electrodes at a suitable speed in the direction indicated. The multiple flexible fingers of metal conform to the surface of the composite and provide the electrical potential difference in a one-dimensional pattern; that is, in line contact. FIG. 1 illustrates such a method.

The electric potential difference applied to the electrodes can be from various sources and frequencies. For example, a 60-hertz source has been found to be satisfactory. However, a potential difference of any frequency from dc to microwaves will similarly affect the composite, as the mechanism apparently depends upon a breakdown between particles within the composite caused by the electric field.

Another suitable method of providing the electrical potential difference may be advantageous when the composite consists of a three-dimensional object such as a molded box or housing. An electrode is applied to the inner surface by metal foil which is easily conformed to the surface in any shape and the electric field than applied between this electrode and a flexible outer electrode which could scan the surface. The scanning may be done either automatically or by hand in the case of a very intricate shape. The inner electrode may also consist of a conducting liquid (e.g., salt water) if the continuity of the part under treatment is leakproof.

A further method of providing the electrical potential difference is by exposure to a microwave field (e.g., in an oven) or by means of an antenna. This method has the significant advantage of being a non-contact application. For example, a flat composite sheet may be passed through a microwave field.

The effect produced by the application of the electric field depends upon the power capabilities of the source. That is, the effect is dependent upon the internal impedance which limits the current output. If an electrode is used which is too long, the current per linear length of electrode may be lower that that which is needed to produce the necessary effect and little change in conductivity may be observed. However, with a larger capacity power source (e.g., a voltage with sufficient volt-ampere capacity), there is no inherent limitation on the length of electrode that may be used for treating a composite.

The means by which dc conductivity and RF transmission are changed by use of the method of the present invention is not completely understood. It is believed, however, that the applied electrical potential difference causes a breakdown of the insulating film of non-conductive matrix material between the electrically conductive material. A network of conducting paths are believed to be formed in the composite, thus providing a bulk property change from low conductivity to high conductivity. Attempts have been made to observe such conducting paths by both visible microscopy and scanning electron microscopy without success. The hypothesis is, however, strengthened by the fact that the current output of the power source (a high voltage, high internal resistance transformer in most experiments) is continuously varying and has a waveform with high frequency components which suggests the presence of minute arcing within the composite. Surface arcing is also sometimes visible when a composite is passed between electrodes. This surface arcing varies with the amount of incorporated electrically conductive material that is near or at the surface of the shielding composite.

The invention is additionally illustrated in connection with the following Examples which are to be considered as illustrative of the present invention. It should be understood, however, that the invention is not limited to the specific details of the Examples.

EXAMPLE 1

A polycarbonate structural foam composite comprised of a matrix denoted as General Electric FL 900 containing 20 percent by weight of a mixture of aluminum flakes and fibers is subjected to a series of treatments wherein an electrical potential difference of increasing magnitude is provided across the composite. The composite measures about $2 \times 6 \times \frac{1}{4}$ inch and is in the form of a sheet. The composite sheet is moved through electrodes as depicted in FIG. 1 which are $1\frac{3}{4}$ inches wide at a speed of 1 inch every 5 seconds. The magnitude of the various potential differences employed and the change in resistance of the composite across its smallest dimension are set forth in Table I below:

TABLE I

| Run | Potential Difference$^a$ (volts) | Resistance (ohms) |
|---|---|---|
| Control | Untreated | Infinite |
| 1 | 1,000 | 34,000 |
| 2 | 3,000 | 3,100 |
| 3 | 6,000 | 60.5 |
| 4 | 9,000 | 26.0 |
| 5 | 12,000 | 43.0 |
| 6 | 15,000 | 43.0 |

$^a$$V_1$-$V_2$ in FIG. 1.

EXAMPLE 2

Three samples of a structural foam composite sheet comprised of a foamed matrix containing 30 percent by weight of aluminum flakes is subjected to a treatment wherein an electrical potential difference of 1000 volts is applied across the sheets. The attenuation in dB of electromagnetic radiation of differing frequencies is measured both before and after the voltage treatment. The results are depicted below in Table II:

TABLE II

| Frequency | | Attenuation in dB of Electromagnetic Radiation | | | | | | | |
|---|---|---|---|---|---|---|---|---|---|
| | (MHz) | 0.5 | 1.5 | 5 | 15 | 50 | 250 | 500 | 960 |
| Sample A | Untreated | 6 | 6 | 6 | 2 | 2 | 4 | 5 | 8 |
| | Treated | 27 | 27 | 27 | 26 | 25 | 18 | 14 | 14 |
| Sample B | Untreated | 4 | 4 | 4 | 4 | 4 | 3 | 4 | 7 |
| | Treated | 38 | 38 | 38 | 38 | 37 | 32 | 30 | 28 |
| Sample C | Untreated | 1 | 1 | 1 | 0 | 0 | 2 | 3 | 8 |
| | Treated | 35 | 35 | 35 | 35 | 34 | 29 | 26 | 21 |

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

We claim:

1. A method of preparing an electromagnetic radiation shielding composite which exhibits high conductivity and low resistance comprising:
   providing a composite comprising an electrically conductive material dispersed within a foamed matrix material; and
   applying an electrical potential difference across said composite such that a first and at least one additional electrical potential difference are applied across said composite, each said potential difference being greater than the potential difference which precedes it and each said additional potential difference which is applied being of such a value so as to increase the conductivity of said composite in comparison to that which said composite exhibited prior to applying said additional electrical potential difference, said additional electrical potential difference being applied and the value thereof being increased until the conductivity of the composite is increased to the extent required to enable the composite to serve as an effective shield for electromagnetic radiation.

2. The method of claim 1 wherein the matrix material is selected for the group consisting of thermoplastic or thermosetting materials.

3. The method of claim 1 wherein the foamed matrix material exhibits a density in excess of 70 percent of the density exhibited by said matrix material in an unfoamed state.

4. The method of claim 1 wherein the matrix material is a thermoplastic material.

5. The method of claim 4 wherein the matrix material is selected from the group consisting of polyethylene and polycarbonate.

6. The method of claim 1 wherein the electrically conductive material comprises carbon fibers.

7. The method of claim 1 wherein the electrically conductive material is selected from the group consisting of metallic solids and metallized non-conductive solids.

8. The method of claim 7 wherein the electrically conductive material comprises metallic solids which are comprised of a material selected from the group consisting of copper, zinc, aluminum, silver, iron, nickel, gold, tungsten, niobium, carbon steel, stainless steel and mixtures thereof.

9. The method of claim 1 wherein the conductive material is dispersed within the matrix material in an amount ranging from about 5 to about 60 percent by weight based on the weight of the composite.

10. The method of claim 9 wherein the conductive material is present in an amount ranging from about 5 to 40 percent by weight based on the weight of the composite.

11. The method of claim 9 wherein the conductive material is present in an amount ranging from about 15 to 30 percent by weight based on the weight of the composite.

12. The method of claim 1 wherein the electrical potential difference which is applied ranges from about 500 to 15,000 volts.

13. The method of claim 1 wherein from two to ten electrical potential differences of differing magnitudes are applied.

14. The method of claim 13 wherein from three to six electrical potential differences of differing magnitudes are applied.

15. The method of claim 1 wherein the value of said at least one additional electrical potential difference exceeds the value of the electrical potential difference which preceeds it by about 25 to 300 percent.

16. The method of claim 1 wherein the value of the electrical potential differences which are applied are increased intermittently.

17. The method of claim 1 wherein the value of the electrical potential differences which are applied are increased continuously.

* * * * *